United States Patent [19]

Morikura et al.

[11] Patent Number: 5,430,763
[45] Date of Patent: Jul. 4, 1995

[54] FREQUENCY STABILIZING CIRCUIT USED FOR A PULSE MODULATOR FOR AN IMAGE SIGNAL INCLUDING A SYNCHRONOUS SIGNAL

[75] Inventors: Susumu Morikura; Hiroaki Nakata, both of Hirakata, Japan

[73] Assignee: Matsushita Electric Industrial Co., Ltd., Osaka, Japan

[21] Appl. No.: 979,834

[22] Filed: Nov. 23, 1992

[30] Foreign Application Priority Data

Nov. 25, 1991 [JP] Japan ................................ 3-308870

[51] Int. Cl.[6] .................... H04K 1/02; H04L 25/03; H04L 25/49
[52] U.S. Cl. .................... 375/296; 375/238; 375/239; 358/330; 332/107; 332/112
[58] Field of Search .................... 375/22, 23, 24, 59, 375/58, 60; 332/107, 109, 112, 113; 455/116, 119, 125, 126; 358/153, 158, 320, 337, 315, 330; 360/29, 30; 348/697

[56] References Cited

U.S. PATENT DOCUMENTS

| | | | |
|---|---|---|---|
| 4,399,472 | 8/1983 | Yamamoto et al. | 358/320 |
| 4,651,213 | 3/1987 | Takimoto | 348/697 |
| 4,772,950 | 9/1988 | Furuhata et al. | 358/337 |
| 4,774,577 | 9/1988 | Takimoto | 358/158 |
| 4,839,615 | 6/1989 | Sato | 358/330 |
| 5,062,005 | 10/1991 | Kitaura et al. | 358/320 |
| 5,134,498 | 7/1992 | Yokoyama | 358/337 |

FOREIGN PATENT DOCUMENTS

| | | |
|---|---|---|
| 1942834 | 8/1969 | Germany . |
| 25050 | 7/1982 | Japan . |
| 2097618 | 4/1982 | United Kingdom . |

*Primary Examiner*—Stephen Chin
*Assistant Examiner*—Don Vo
*Attorney, Agent, or Firm*—Price, Gess & Ubell

[57] ABSTRACT

The present invention discloses a frequency stabilizing circuit used for a modulator that modulates an image signal including a synchronous signal into a pulse modulation signal. The frequency stabilizing circuit comprises a detecting device for detecting the synchronous signal included in the image signal that has not been modulated to output a pulse based on the detection, a pulse generating device for outputting a pulse by extracting a modulated signal outputted from the pulse modulator corresponding to the synchronous signal, and a feedback controlling device for increasing and/or decreasing a level of the image signal to be inputted to the pulse modulator in accordance with the difference between the pulse width of the pulse signal outputted from the detecting device and that of the pulse signal outputted from the pulse generating device.

59 Claims, 9 Drawing Sheets

FREQUENCY STABILIZING CIRCUIT USED FOR A PULSE MODULATOR FOR AN IMAGE SIGNAL INCLUDING A SYNCHRONOUS SIGNAL

BACKGROUND OF THE INVENTION (1) Field of the Invention

The present invention relates to a frequency stabilizing circuit used for a pulse modulator that modulates an image signal including a synchronous signal into a pulse modulation signal.

(2) Description of the Related Art

Recent development in the field of a fiber-optic transmission technology makes it possible to transmit an analog signal such as an image signal.

There are various modulation methods available for the image transmission such as analog, pulse, and digital modulations. However, a primary choice is pulse modulation that generally modulates an image signal into a pulse signal having amplitudes of 1 and 0, while modulating its pulse repetition cycle and/or its width analogously. Because it not only minimizes influence of non-linear distortion on transmission lines effectively, but also simplifies the construction of a modulator and a demodulator, PFM(Pulse Frequency Modulation) is most suitable for image signal transmission because its post-transmission noise is delta noise which is hardly noticeable. For this reason, PFM has been used widely in the image signal transmission via optical fibers these days.

FIG. 1 shows frequency characteristics of an output signal from a modulator for PFM. An output pulse signal's frequency f varies in proportion to an input image signal's voltage V, and its characteristics are determined by the capacity of a capacitor incorporated in the modulator or a modulator's response speed. These devices are susceptible to fluctuation in ambient temperature and in power source voltage; the frequency characteristics change in response to such fluctuations. For example, the frequency characteristics expressed as a solid line change to a dotted line or an alternating and short dot line due to temperature or voltage fluctuations. In other words, a frequency f1 corresponding to an input voltage V1 changes to a frequency f2 or a frequency f3.

Frequency fluctuation is a critical problems to be resolved, because it not only deteriorates the linearity of the transmitted image signal, but also makes frequency characteristics unstable. A relatively easy method to minimize the frequency fluctuation is to employ an element or a circuit that maintains reverse characteristics to those of the capacitor so as to compensate the operation of the modulator. However, when its accuracy is concerned, such a compensation is effective only in a limited operation range and for a limited period.

As for a method to stabilize the frequency for a longer period, an automatic frequency stabilizing circuit is disclosed in Japanese Laid-Open Patent Application No. 2-5050. According to this method, the frequency of an output signal from the modulator for PFM is detected to be compared with that of a standard signal from another circuit incorporated in the circuit, and the difference therebetween is fed back to the input unit of the modulator.

For further explanation, the detailed construction of such an automatic frequency stabilizing circuit is explained with referring to FIG. 2.

The frequency stabilizing circuit is composed of a modulator 1 for PFM, a clamping circuit 2, an adder 3, a synchronous signal sampling circuit 4, a duty compensating circuits 5 and 7, a standard frequency oscillator 6, a digital phase comparator 8, a switch unit 9 a charge pumping circuit 10 including switches 10a and 10b as well as a capacitor 11, and a lowpass filter 12.

An image signal including a synchronous signal is inputted to the modulator 1 via the clamping circuit 2 and adder 3. Upon the receipt of the image signal, the modulator 1 modulates it into a pulse signal with[a frequency fa, and outputs it as an output PFM signal to the outside apparatus as well as to the duty compensating circuit 5. The standard frequency oscillator 6 operating independently to the modulator 1 outputs a signal with a specific frequency fb to the duty compensating circuit 7. Both the frequencies fa and fb are inputted into the digital phase comparator 8 from the respective duty compensating circuits, so that it compares these two frequencies. However, since the PFM signal's frequency fa varies due to the modulation, only a stable frequency fa corresponding to the synchronous signal must be sent to the capacitor 11. For this reason, the synchronous signal sampling circuit 4 detects the synchronous signal, and outputs a detection signal to the switch unit 9 as an enable signal.

When the frequency fa is lower than the frequency fb(fa<fb), the switch 10a is turned on so as to charge the capacitor 11, whereby a voltage inputted to the lowpass filter 12 is increased. Accordingly, the output voltage from the lowpass filter 12 and hence the image signal's voltage inputted to the modulator 1 is increased by means of adder 3. Then, a frequency of the PFM signal outputted from the modulator 1 is also increased. The foregoing operation is repeated until the frequencies fa and fb become subsequently equal.

In contrast, when fa is higher than fb(fa>fb), the switch 10b is turned on so as to discharge the capacitor 11, whereby a voltage inputted to the lowpass filter 12 is decreased. Accordingly, the output voltage from the lowpass filter 12 and hence the image signal's voltage inputted to the modulator 1 is decreased by means of the adder 3. Then, a frequency of the PFM signal outputted from the modulator 1 is also decreased. The foregoing operation is repeated until he frequencies fa and fb become subsequently equal.

In summary, the conventional frequency stabilizing circuit compares the two frequencies of the output signals, one from the modulator 1 and the other from the standard frequency oscillator 6, using the digital phase comparator 8, and stabilizes the frequency by either charging or discharging the capacitor 11. However, given that the PFM signal outputted from the modulator 1 has a very high frequency, devices such as digital phase comparator 8 and standard frequency oscillator 6 must be constructed as such, which invites a high-speed and large-scale signal processing circuits that require a large amount of running electricity as well as manufacturing cost. In addition, the conventional frequency stabilizing circuit can not resolve the problem of noise due to its construction that includes essentially two signal generators: the modulator 1 and standard frequency oscillator 6. Moreover, it should be noted that such noise may further cause an error thereof.

SUMMARY OF THE INVENTION

The present invention therefore has an object to provide a frequency stabilizing circuit used for a pulse modulator, which can operate with a low-speed signal processing circuit while maintaining high quality transmission characteristics.

The above object is fulfilled by a frequency stabilizing circuit for stabilizing an output frequency of a pulse signal outputted from a pulse modulator included therein that modulates an image signal including a synchronous pulse signal. The circuit comprises a detecting device for detecting the synchronous signal included in the image signal that has not been modulated to output a pulse based on the detection, a pulse generating device for outputting a pulse by extracting a modulated signal outputted from the pulse modulator corresponding to the synchronous signal, and a feedback controlling device for increasing and/or decreasing a level of the image signal to be inputted to the pulse modulator in accordance with the difference between the pulse width of the pulse signal outputted from the detecting device and that of the pulse signal outputted from the pulse generating device.

The detecting device may include a level detecting circuit for detecting a synchronous signal width by judging the level of the image signal, and a pulse outputting circuit for outputting a pulse signal with a given pulse width when the level detecting circuit detects the synchronous signal.

The pulse generating device may be designed so that it activates upon the receipt of the synchronous signal from the level detecting circuit as an enable signal.

The pulse generating device may include a divider for dividing the frequency of the modulated signal with a given dividing ratio.

The divider may be set with a dividing ratio N such that satisfies a expression $N = f \cdot W$, provided that f is a constant frequency from the modulated pulse signal corresponding to the synchronous signal of the image signal, and W is a pulse width of the pulse outputted from the detecting device.

The level detecting circuit may consist of a voltage source having a given voltage and a comparator that compares the voltage level of the image signal and the given voltage level of the voltage source, and activates its output signal when the former is lower than the latter, and the pulse detecting circuit may consist of a time constant circuit based on which a pulse width W is determined and a monostable multivibrator that outputs a pulse signal that has a pulse width comparable to the time constant of the time constant circuit when the comparator activates its output signal.

The pulse modulator may be designed so that it uses a modulation method by which the numbers of pulses of the modulation signal per unit time is changed in accordance with the voltage level of the image signal inputted.

The pulse modulator may be a modulator selected from the group consisting of modulators for Pulse Frequency Modulation, Square Wave Frequency Modulation, and Pulse Interval Modulation.

The feedback controlling device may include a pulse width comparing device for comparing the pulse width of the pulse signal outputted from the detecting device and that of the pulse signal outputted from the pulse generating device to output a pulse signal having a pulse width comparable to the difference of these two pulse widths, an integrating device for integrating the pulse signal from the pulse comparing device to output an integral signal of which voltage level is comparable to the pulse width, and an adding device for adding the integral signal to the image signal that has not been modulated.

The pulse width comparing device may consist of a flip-flop that is set by one of the trailing edge of the pulse signal outputted from the detecting device and that of the pulse signal outputted from the pulse generating device and reset by the trailing edge of the other pulse signal, and a delay element that delays the input of the pulse signal to the input terminal of the reset side by a given delay time.

The detecting device and the pulse generating device may be designed so that the pulse signals outputted from these devices have the same pulse widths when the frequency of the synchronous signal does not fluctuate, the input terminal of the reset side of the flip-flop may be attached to the delay element, and the delay element may be set with a delay time to guarantee that the trailing edge of the pulse signal inputted into the reset side is inputted after the pulse signal to be inputted to the set side.

The pulse modulator may be designed so that it uses a modulation method by which the number of pulses of the modulation signal per unit time is changed in accordance with the voltage level of the image signal inputted.

The above object is also fulfilled by a frequency stabilizing circuit. The circuit comprises a synchronous signal detecting device for detecting the synchronous signal included in the image signal that has not been modulated, a first pulse generating device for generating a first pulse related to the synchronous signal included in the image signal that has not been modulated, a second pulse generating device for generating a second pulse related to the frequency of the modulation pulse signal outputted from the pulse modulator upon the detection of the synchronous signal, and a feedback controlling device for increasing and/or decreasing a level of the image signal to be inputted into the pulse modulator in accordance with the difference between the pulse widths of the first pulse and the second pulse.

The frequency stabilizing circuit constructed as above makes it possible to stabilize the frequency from the modulator for PFM by detecting the synchronous signal included in the image signal to compare the pulse width of the detected synchronous signal and that of the divided pulse signal.

Such stabilization of the frequency enables application of the low-speed comparing circuits and controlling circuits, which leads to reducing running electricity and manufacturing cost as well as promoting a conversion to integrated circuits. Moreover, this control makes it possible to maintain high quality transmission characteristics for a longer period compared with the conventional ones regardless of fluctuation of condition such as voltage and temperature.

In addition, Given that the frequency stabilizing circuit of the present invention is designed so that it functions with only one signal Generator, it resolves the problem of noise, thus eliminating a possibility for an error of the circuit.

BRIEF DESCRIPTION OF THE DRAWINGS

These and other objects, advantages and features of the invention will become apparent from the following description thereof taken in conjunction with the accompanying drawings which illustrate a specific embodiment of the invention. In the drawings.

DESCRIPTION OF THE PREFERRED EMBODIMENT

In this embodiment, a frequency stabilizing circuit including a modulator for PFM is explained with referring to FIGS. 3–6.

Figure 1:
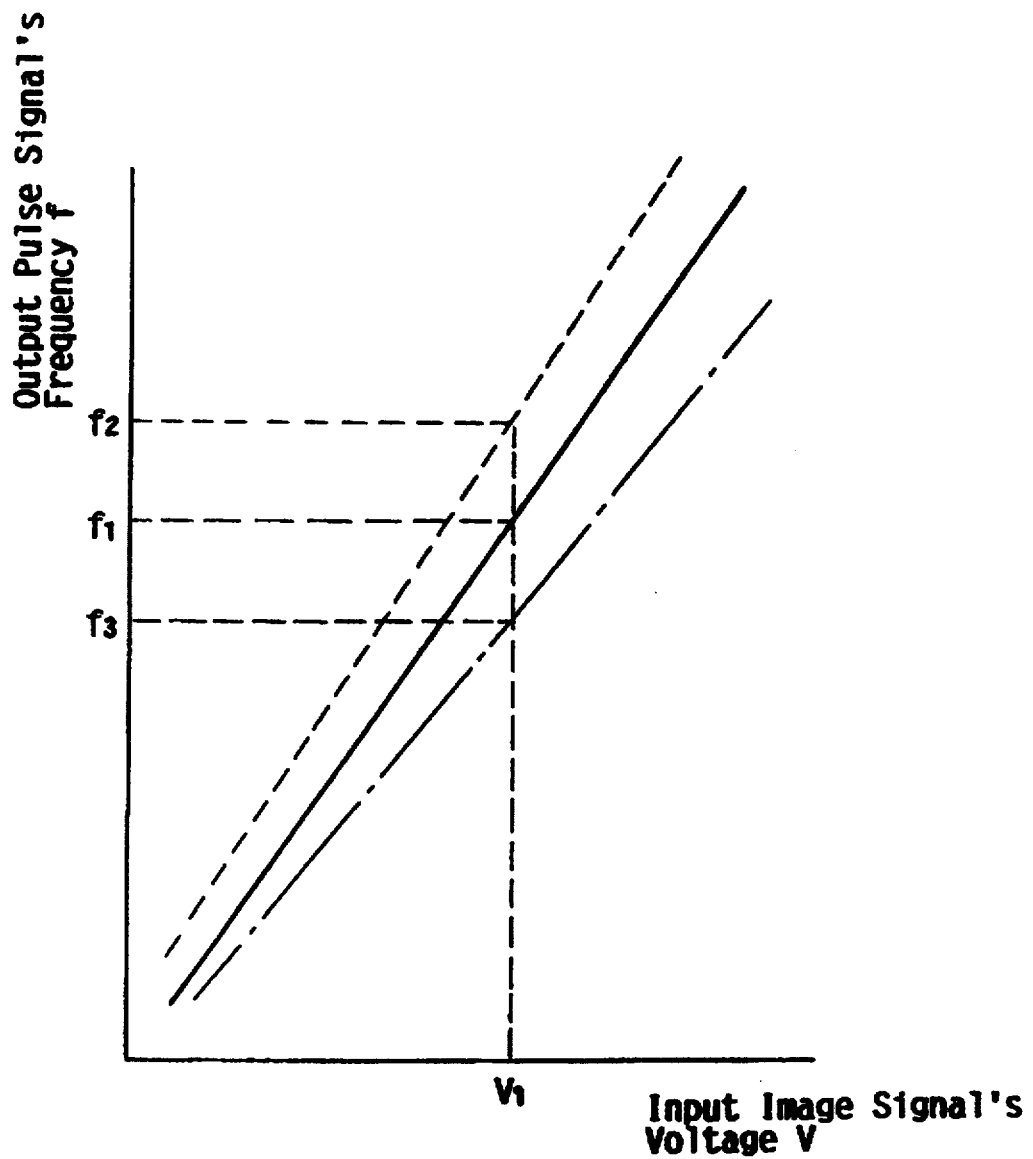
FIG. 1 is a graph depicting frequency characteristics of the output signal from the modulator 20.
Figure 2:
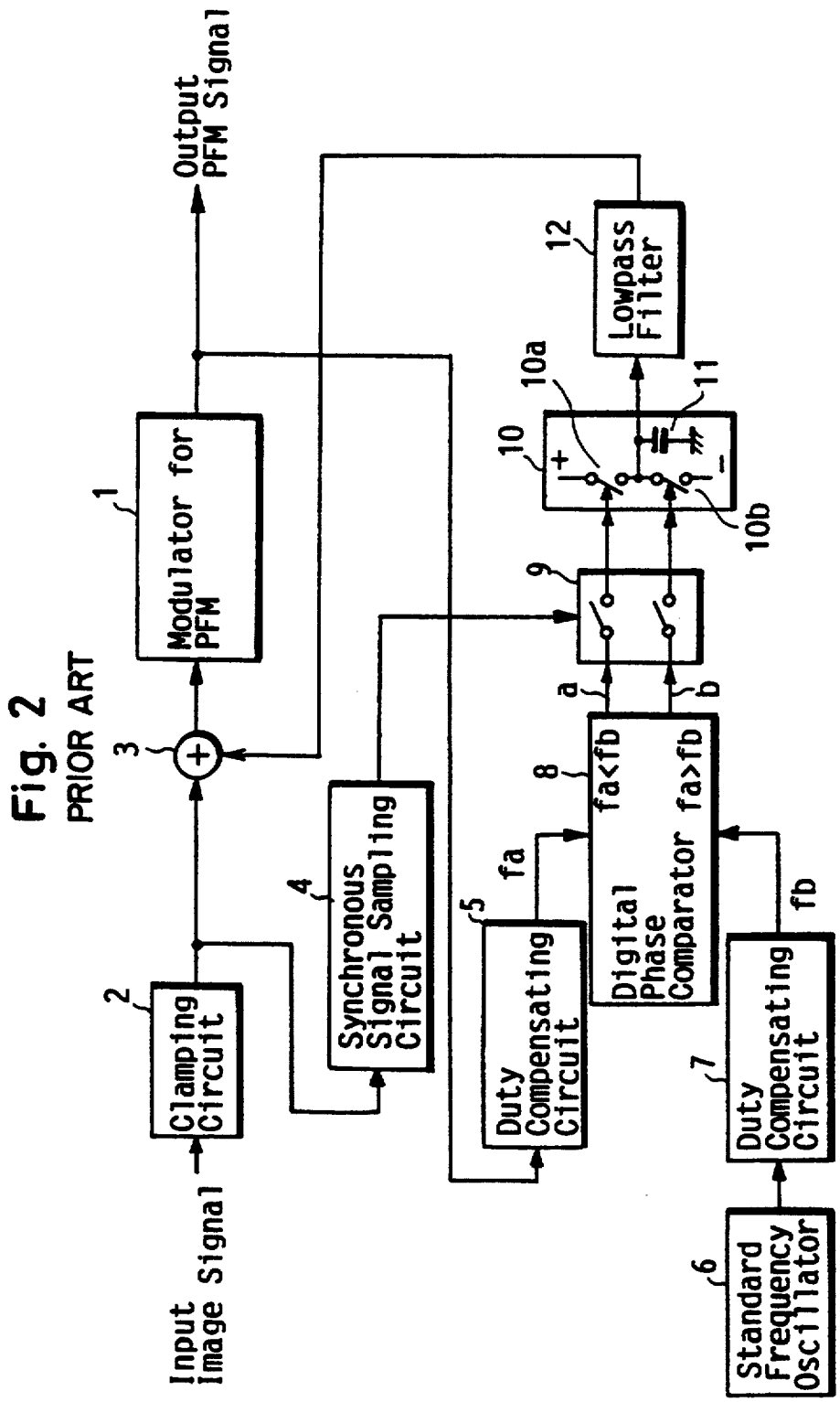
FIG. 2 is a block diagram of the conventional frequency stabilizing circuit used for the pulse modulator.
Figure 3:
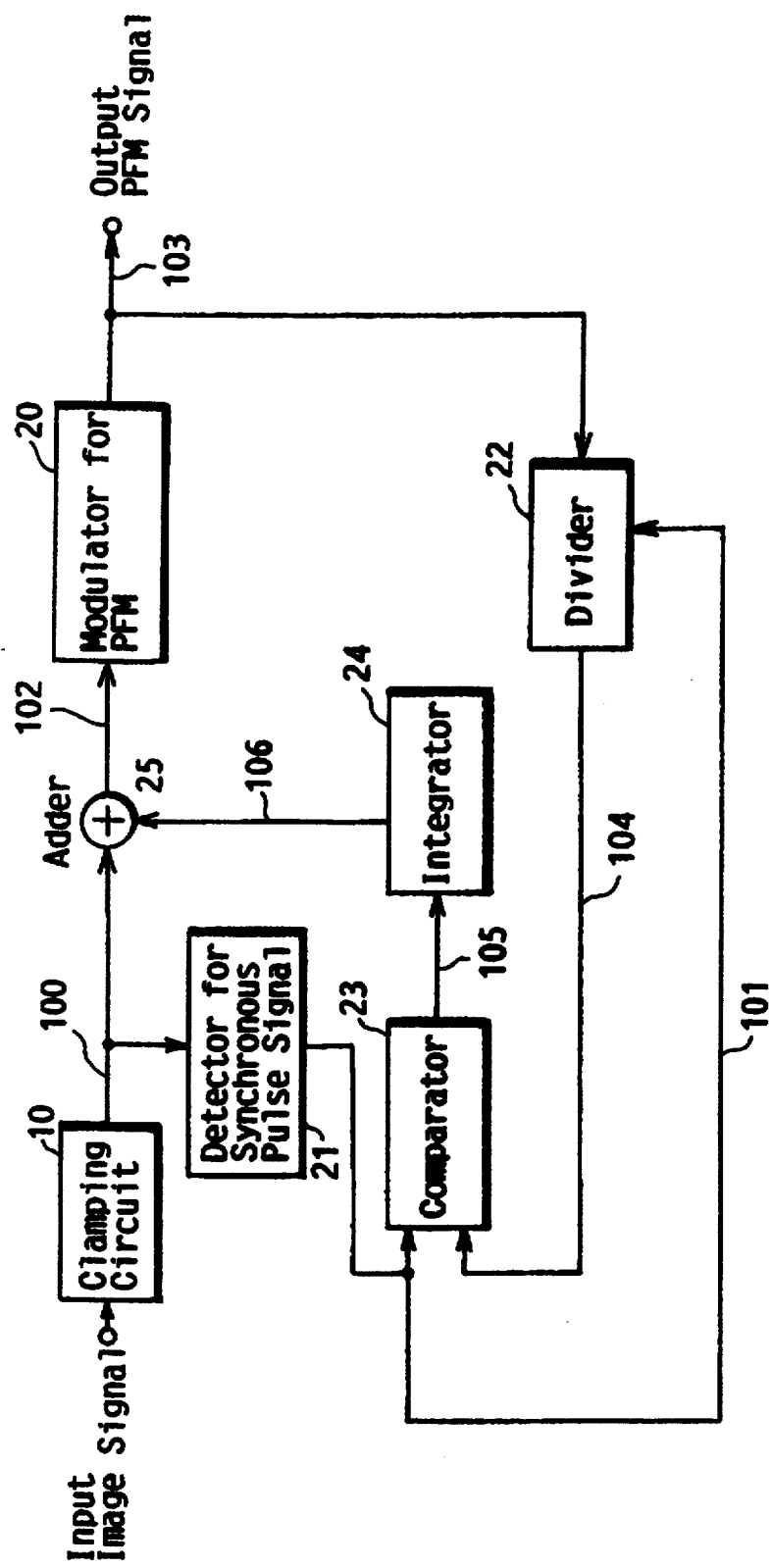
FIG. 3 is a block diagram of the frequency stabilizing circuit used for the pulse modulator of the present invention.

As is shown in FIG. 3, the frequency stabilizing circuit is composed of a clamping circuit 10, a modulator 20 for PFM, a detector 21 for a synchronous signal, a divider 22, a comparator 23, an integrator 24, and an adder 25.

The clamping circuit 10 clamps the voltage of image signal to a specific voltage level when it is lower than the specific voltage level.

The modulator 20 modulates an image signal 100 inputted via the clamping circuit 10 and the adder 25 into a pulse signal, or an PFM signal 103.

Figure 4:
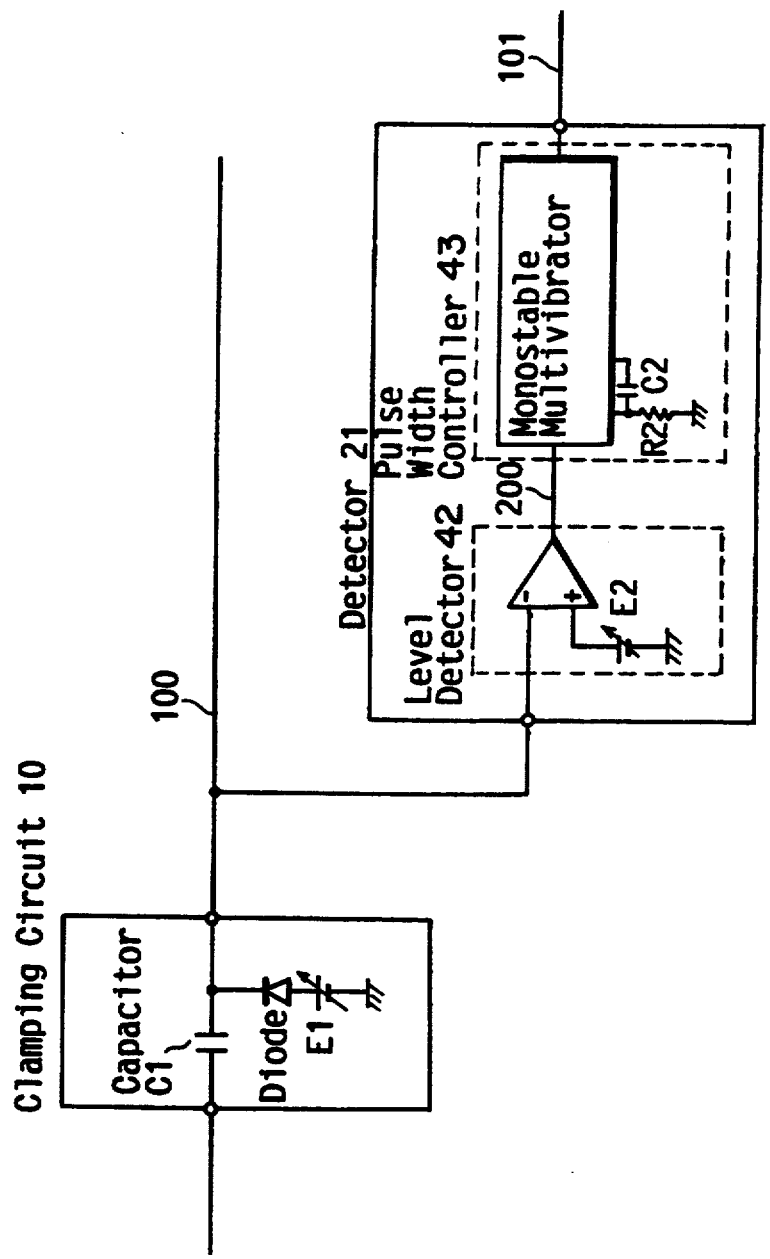
FIG. 4 is a view depicting the construction of the detector 21.

The detector 21 detects a synchronous signal included in the image signal 100, and sends the first detection pulse signal and the second detection pulse signal to the comparator 23 and divider 22, respectively. The first and second detection pulse signal are same signals, and their pulse widths Wb are as wide as that of the synchronous signal. FIG. 4 shows the more detailed construction of the clamping circuit 10 and detector 21. The former is composed of a capacitor C1, a diode, and a power source with a voltage E1; it clamps the voltage of the image signal 100 inputted through the capacitor C1 to the level of the voltage E1 when it is lower than the voltage E1 using the diode and power source. The latter is composed of a level detector 42 including a comparator and a power source with a voltage E2 and a pulse width controller 43 including a monostable multivibrator, a capacitor C2, and a resistance R2; the level detector 42 detects a voltage lower than the voltage E2 from the clamped image signal 100 and identifies it with a synchronous pulse signal, while the pulse width controller 43 is triggered by the starting edge of the detected synchronous pulse signal, and outputs a pulse signal as a detection pulse signal 101.

The divider 22 acknowledges the detection pulse signal 101 as an enable signal, and divides the frequency of the PFM signal 103 by a given dividing ratio N. Given that the synchronous pulse signal in the PFM signal 103 maintains a stable frequency, it divides only this stable frequency so as to obtain a divided signal 104 with a stable divided frequency.

Figure 5:
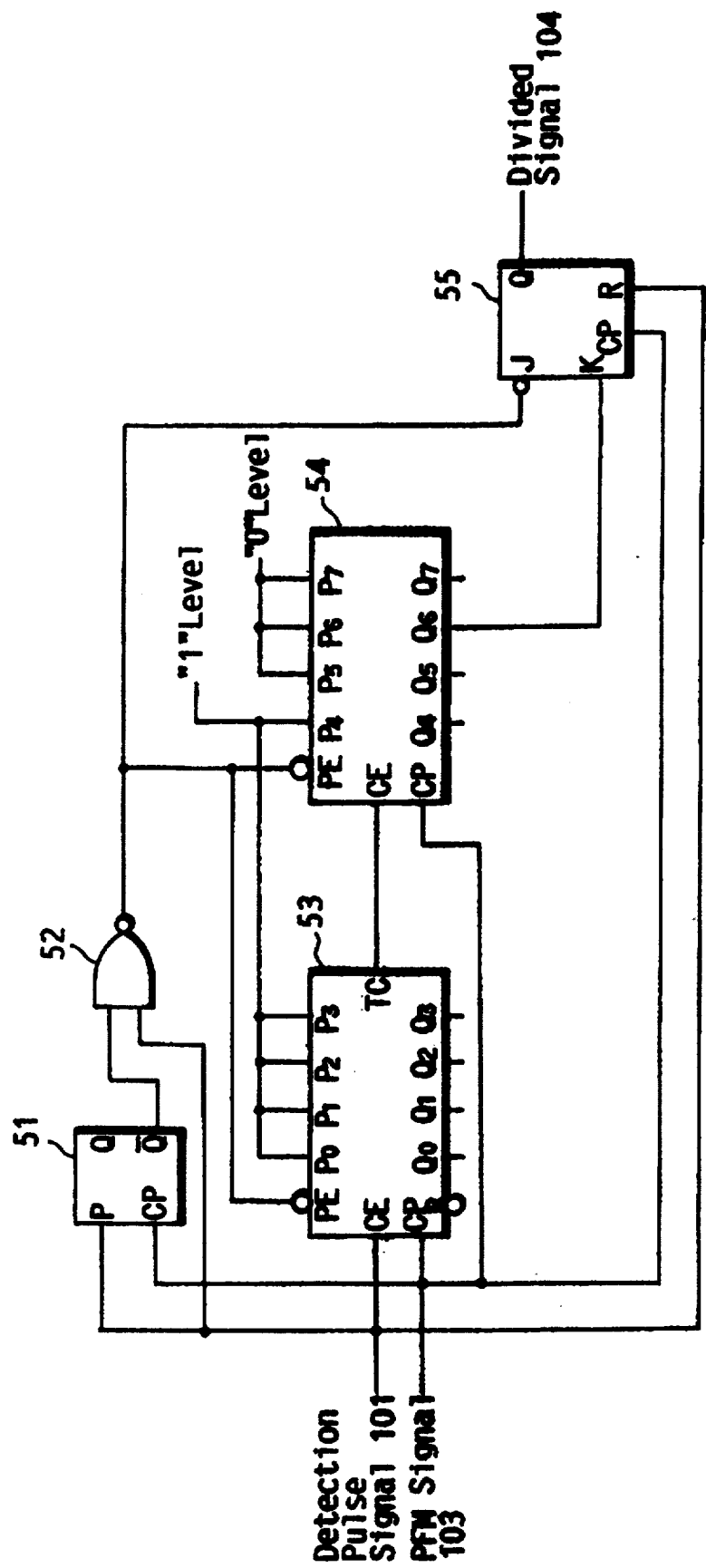
FIG. 5 is a view depicting the construction of the divider 22.

As is shown in FIG. 5, the divider 22 is composed of the 25 first flip-flop 51 and the second flip-flop 55, an AND circuit 52, and 4-bit binary counters 53 and 54 constituting a 8-bit counter. As well, it is set with the dividing ratio 33. The first flip-flop 51 and AND circuit 52 output a pulse signal with a pulse width for one cycle at the rising edge of the PFM signal 103. This pulse signal is inputted to the PE(Parallel Enable) terminals of the binary counters 53 and 54 as well as a J-terminal of the second flip-flop 55 to activate them, whereby the binary counters 53 and 54 load the initial value "00011111" inputted to their P7-P0 terminals, respectively. On the other hand, when CE(Count enable) terminals thereof are activated by the detection pulse signal 101, they start counting the number of the pulses of the PFM signal 103 inputted to CP(Count Pulse) terminals from the initial "00011111" up to "01000000", whereby the binary counter 54 outputs "1" from its Q6-terminal to a K-terminal of the second flip-flop 55. The second flip-flop 55 outputs a signal with a logical level "1" when its J-terminal is activated, and maintains the level until its K-terminal is activated, thus outputting the divided signal 104 from its Q-terminal synchronously with the PFM signal 103. In summary, the second flip-flop 55 outputs the divided signal 104 by counting 33 pulses of the PFM signal 103, counting from "00011111" up to "01000000" using the binary counters 53 and 54.

Figure 6:
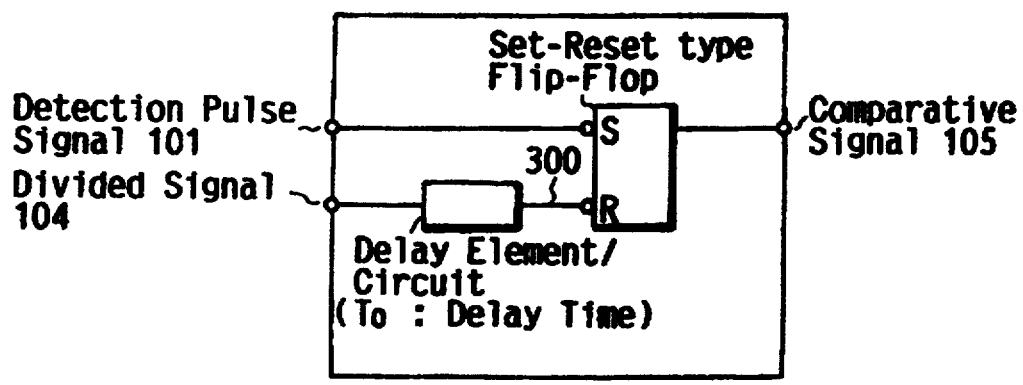
FIG. 6 is a view depicting the construction of the comparator 23.

FIG. 6 shows a detailed construction of the comparator 23, which is composed of a delay element or delay circuit such as a delay line, and a flip-flop. The former delays the divided signal 104 to guarantee a pulse width of the comparative signal 105, and the latter outputs a pulse signal by being set at the falling edge of the detection pulse signal 101 and reset at that of the divided signal 104. It compares the two pulse widths of the detection pulse signal 101 and the divided signal 104, thence selectively outputs a pulse signal as a comparative signal 105 with one of the three following pulse widths based on its comparing result:

1) when the divided signal 104 and detection pulse signal 101 maintain the same pulse width, it outputs the comparative signal 105 with a standard pulse width To;
2) when the divided signal 104 maintains a wider pulse width than the detection pulse signal 101, it outputs the comparative signal 105 with a pulse width T which is wider than To by the difference therebetween; and
3) when the divided signal 104 maintains a narrower pulse width than the detection pulse signal 101, it outputs the comparative signal 105 with a pulse width T' which is narrower than To by the difference therebetween.

The integrator 24 integrates the comparative signal 105, thence selectively outputs an integral signal 106 with one of the three following voltages based on the integrating result:

1) when the pulse width of the comparative signal 105 is as wide as the standard pulse width To (T, T'=To), it outputs the integral signal 106 with a standard voltage Vo;
2) when the pulse width of the comparative signal 105 is wider than the standard pulse width To (T>To), it outputs the integral signal 106 with a voltage higher than the standard voltage Vo; and
3) when the pulse width of the comparative signal 105 is narrower than the standard pulse width To (T'<To), it outputs the integral signal 106 with a voltage lower than the standard voltage Vo.

The adder 25 adds the integral signal 106 to the input image signal 100, and outputs a sum signal 102 to the modulator 20.

Figure 7:
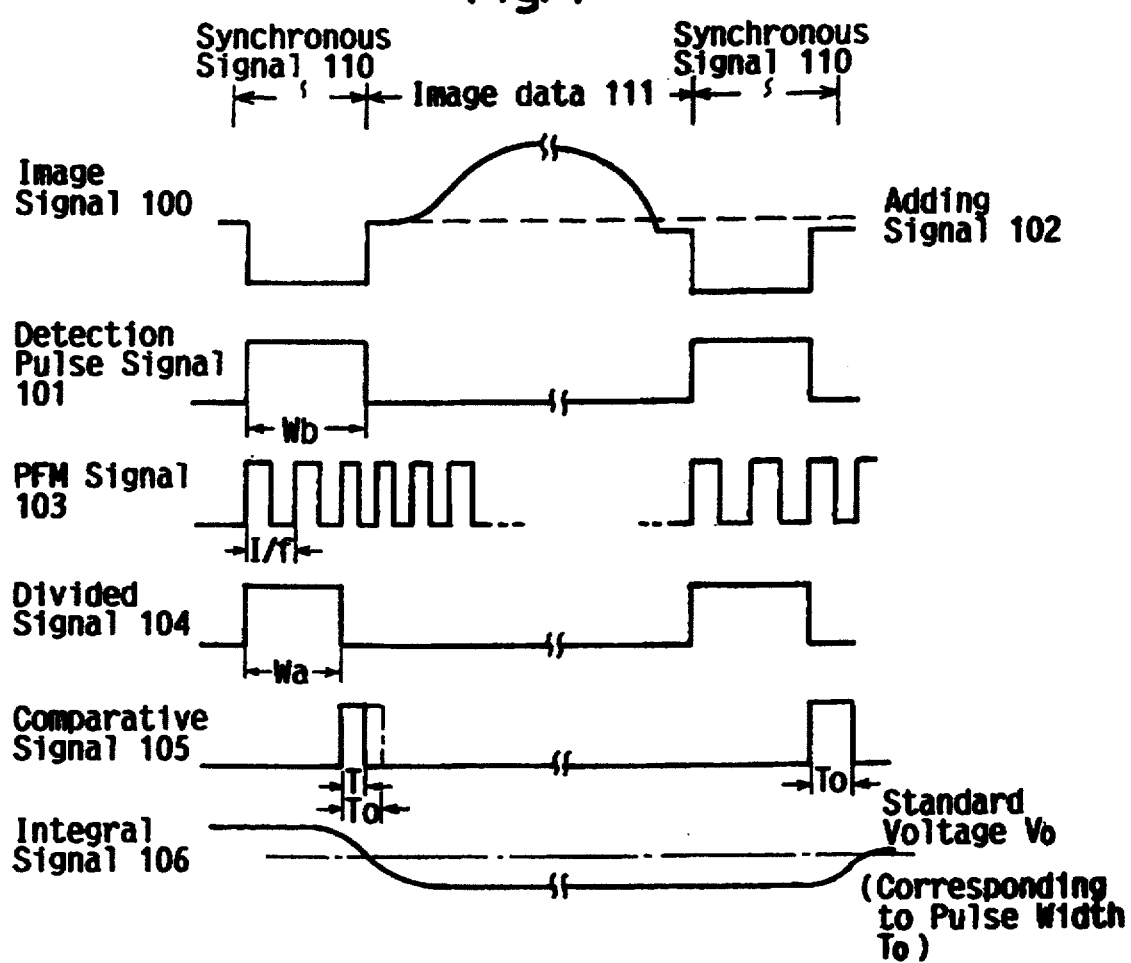
FIG. 7 is an illustration of wave forms of the pulse signals outputted from the frequency stabilizing circuit in FIG. 3.
Figure 8:
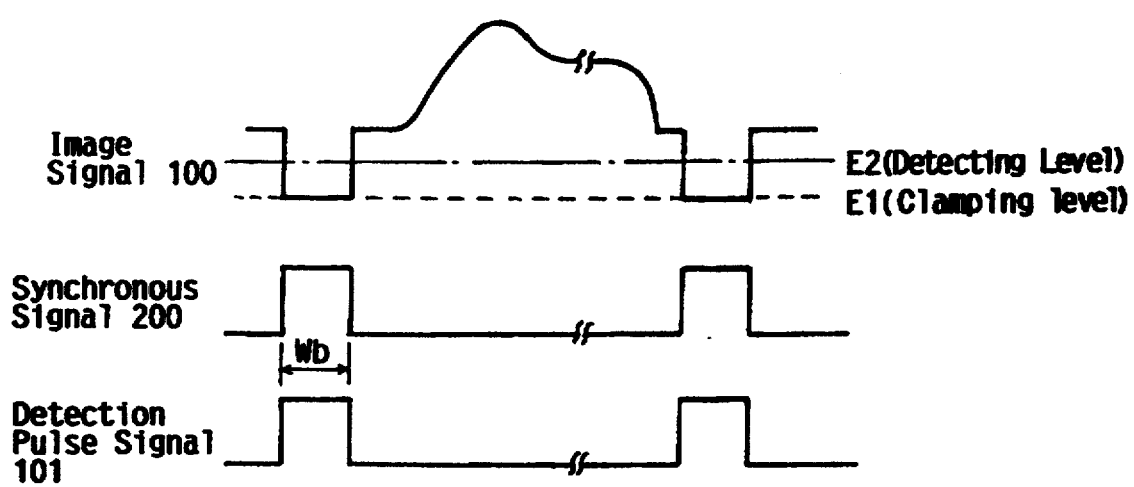
FIG. 8 is an illustration of wave forms of the pulse signals outputted from the detector 21 in FIG. 5.
Figure 9:
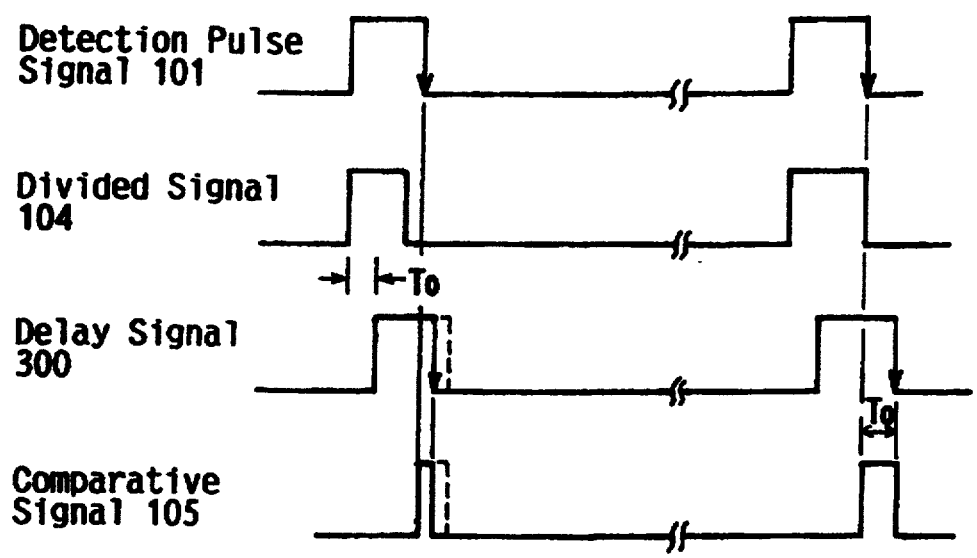
FIG. 9 is an illustration of wave forms of the pulse signals outputted from the comparator 23 in FIG. 6.

The operation of the frequency stabilizing circuit constructed as above is explained with referring to FIGS. 7-9.

As shown in FIG. 7, the image signal 100 consists of the synchronous signal 110 and image data 111, and the synchronous signal 110 maintains a specific pulse width in accordance with a kind of the image signal. For example, in a so-called Hi-Vision Television(High Definition Television), its luminance signal Y maintains a specific pulse width of 0.6 $\mu S$. The synchronous signal 110 is detected by the detector 21 and outputted as the detection pulse signal 101 whose wave form is shown in FIG. 7.

As previously explained, the clamping circuit 10 clamps the voltage of the image signal 100 to the level of the voltage E1 when it is lower than the voltage E1, so that the level detector 42 detects the synchronous signal 110 by detecting a voltage lower than the voltage level E2, thence outputs the detection result as a synchronous signal 200 whose wave form is shown in FIG. 8.

Further, the pulse width controller 43 is triggered by the rising edge of the synchronous signal 200, and outputs the detection pulse signal 101 with the pulse width Wb. For explanation's convenience, the detection pulse signal 101 and synchronous signal 200 have the same pulse width Wb, and the pulse width Wb can be found by selecting an appropriate time constant R1C2.

On the other hand, the image signal 100 is modulated into the PFM signal 103 by the modulator 20 via the clamping circuit 10 and adder 25. The wave form of the PFM signal 103 is shown in FIG. 7. Given that the synchronous signal 110 maintains a specific pulse width, or namely clamping level of the voltage E1, it maintains a specific frequency f as well, provided that the voltage or ambience temperature do not fluctuate.

The frequency of the PFM signal pulse 103 is divided so that it has a wider pulse width by the divider 22 that activates upon the receipt of the detection pulse signal 101 as the enable signal; For this reason, it only outputs the divided signal 104 while the detector 21 detects the synchronous signal 110.

More precisely, the binary counters 53 and 54 as well as the J-terminal of the second flip-flop 55 are activated at the rising edge of the detection pulse signal 101 by means of the first flip-flop 51 and AND gate 52: the binary counters 53 and 54 load the initial counting value "00011111" and starts counting the number of the pulses of the PFM signal 103 every time its rising edge is inputted thereto, while Q-terminal of the second flip-flop 55 outputs a signal with a logical level "1". When the binary counters 53 and 54 count up to "01000000" the Q6-terminal of the latter outputs "1" to the K-terminal of the second flip-flop 55, whereby the Q-terminal of the second flip-flop 55 drops the level of the signal to "0", from "1", thus outputting a signal with a pulse width comparable to 33 pulses as the divided signal 104. The wave form of the divided signal 104 shown in FIG. 7 is an example when the divider 22 counts 2 pulses of the PFM signal.

Assuming that the frequency f is the frequency of the PFM signal 103 corresponding to the synchronous signal 110 and N is the dividing ratio of the divider 22, the pulse width Wa of the divided signal 104 is expressed as $Wa = N/f.$ It is understood from this expression that when the dividing ratio N is a constant number, it is the frequency f that determines the pulse width Wa.

For this reason, when the dividing ratio N is a number such that makes the pulse widths Wb and Wa equal, the deviation of frequency f can be detected by comparing the pulse widths Wa and Wb, because it is the pulse width Wa that changes due to the deviation of the frequency f.

The comparator 23 compares which of these two pulse widths is larger than the other, and outputs the comparing result as the comparative signal 105. More precisely, the delay element delays the divided signal 104 for a delayed time To whose wave form is shown as a delay signal 300 in FIG. 9. Further, since the flip-flop is set by the falling edge of the detection pulse signal 101 and reset by the falling edge of the divided signal 104, it outputs a pulse signal as the comparative signal 105 that maintains the pulse width comparable to the time interval between the two falling edges. The wave form of the comparative signal 105 is shown in FIG. 9. The comparator 23 outputs the comparative signal 105 with a pulse width T comparable to the delayed time To when the pulse widths Wa and Wb are same. The pulse width T is increased and decreased in proportion to that of the pulse widths Wa to Wb.

Assuming that the dividing ratio N is 33, the pulse width Wb is 0.6 $\mu S$, and the frequency f is 55 MHz, when the frequency f increases to 56 MHz due to the temperature and power supply fluctuation, the correlation between the pulse widths Wa and Wb is expressed as $Wa = 33/56 \text{ MHz} = 0.59 \ \mu S < Wb$ Under these conditions, the pulse width T of the comparative signal 105 becomes narrower than the standard pulse width To. Since the comparative signal 105 is integrated by the integrator 24, the voltage V of the integral signal 106, whose wave form is shown in FIG. 7, becomes lower than the standard voltage Vo.

As a result, the voltage of the adding signal 102 obtained by adding the integral signal 106 to the image signal 100 at the adder 25 is decreased, and so is the frequency f of the PFM signal 103. Thus, the frequency f is decreased to 55 MHz, making the pulse widths Wa and Wb equal (Wa=Wb). Likewise, the pulse width of the comparative signal 105 and the voltage of the integral signal 106 are compensated to the standard pulse width To and standard voltage Vo, respectively. Hence, the frequency of the modulator 20 is stabilized.

On the other hand, when the frequency f decreased to 54 MHz due to the temperature and power supply fluctuation, the correlation between the pulse widths Wa and Wb is expressed as $Wa = 33/54 \text{ MHz} = 0.61 \ \mu S > Wb$ Under these condition, the comparator 23 outputs the comparative signal 105 having a pulse width wider than the standard pulse width To. Since the comparative signal 105 is integrated by the integrator 24, the voltage V of the integral signal 106 becomes higher than the standard voltage Vo.

As a result, the voltage of the adding signal 102 obtained by adding the integral signal 106 to the image signal 100 at the adder 25 is increased, and so is the frequency f of the PFM signal 103. Thus, the frequency f is increased to 55 MHz, making the pulse widths Wa and Wb equal (Wa=Wb). Likewise, the pulse width of the comparative signal 105 and the voltage of the integral signal 106 are compensated to the standard pulse width To and standard voltage Vo, respectively. Hence, the frequency of the modulator 20 is stabilized.

As was explained in the above, the frequency stabilizing circuit of the present invention stabilizes the frequency by feeding back the difference between the synchronous pulse width of the image signal 100 and that of the pulse signal divided from PFM signal 103: when the latter becomes wider or narrower than former, the difference thereof are smoothed by the integrator 24 and fed back to the input voltage of the modulator 20.

It is desirable to have an integer as the dividing ratio N by using the following calculation.

Assuming that the image signal is a luminance signal for Hi-vision television, the frequency bandwidth thereof is 20 MHz, the pulse width of synchronous signal is 0.6 μS, and the frequency f is 55 MHz (the frequency f exceeds the frequency bandwidth by a factor of 2 in sampling theory, but it does by a factor of 2.5 concerning margins in practical), the dividing ratio N can be found by $$N = f \times Wb = 55 \text{ MHz} \times 0.6 \text{ } \mu S = 33.$$

Assuming that the image signal is a luminance signal for Hi-vision television, the frequency bandwidth thereof is 30 MHz, the pulse width of synchronous signal is 0.6 μS, and the frequency f is 75 MHz, N can be obtained by $$N = f \times WD = 75 \text{ MHz} \times 0.6 \text{ } \mu S = 45.$$

Assuming that the image signal is a signal for NTSC (National Television System Committee), the frequency bandwidth thereof is 4.2 MHz, the pulse width of synchronous signal is 5.1 μS, and the frequency f is 10.6 MHz, the dividing ratio N can be obtained by $$N = f \times Wb = 10.6 \text{ MHz} \times 5.1 \text{ } \mu S = 54.$$

As can be understood from any foregoing case, the dividing ratio N becomes an integer by arbitrary selecting the frequency of the PFM signal 103, which further facilitates the operation of the divider 22.

The pulse width Wb of the first detected pulse signal to the comparator 23 from the detector 21 may be set arbitrary by the time constant R1C2. In this case, the dividing ratio N such that makes the pulse widths Wa(=N/f) and Wb equal is found in the first place, and the time constant R1C2 is adjusted so the dividing ratio N becomes an integer.

The second detection pulse signal inputted to the divider 22 is used as the enable signal for the divider 22, and it maintains the same pulse width as that of the first detection pulse signal. However, it may have a different pulse width. For example, the pulse width of the first detection pulse signal may be narrower when the divider 22 is designed so that it is triggered by the rising edge of the second detection pulse signal, and waits for another trigger once it has outputted the divided signal 104.

Although the present invention has been fully described by way of examples with reference to the accompanying drawings, it is to be noted that various changes and modifications will be apparent to those skilled in the art. Therefore, unless such changes and modifications depart from the scope of the present invention, they should be construed as being included therein.

What is claimed is:

1. A frequency stabilizing circuit for stabilizing an output frequency of a signal outputted from a pulse modulator that modulates an image signal including a synchronous signal, the circuit comprising:

detecting means for detecting, before modulation, the synchronous signal included in the image signal and for outputting a first pulse signal based on the detection;

pulse generating means for outputting a second pulse signal representative of the synchronous signal after pulse modulation of the image signal by extracting a modulated signal outputted from the pulse modulator; and feedback controlling means for detecting a difference between a pulse width of the first pulse signal outputted from the detecting means and a pulse width of the second pulse signal outputted from the pulse generating means and for increasing and decreasing, depending on the detected difference, a voltage level of the image signal to be inputted to the pulse modulator.

2. The frequency stabilizing circuit of claim 1, wherein the detecting means includes:

a level detecting circuit for detecting the synchronous signal by judging the level of the image signal; and a pulse outputting circuit for outputting the first pulse signal with a given pulse width when the level detecting circuit detects the synchronous signal.

3. The frequency stabilizing circuit of claim 2, wherein the pulse generating means is designed so that it uses the detected synchronous signal from the level detecting circuit as an enable signal.

4. The frequency stabilizing circuit of claim 1, wherein the pulse generating means includes a divider for dividing the frequency of the modulated signal by a given dividing ratio.

5. The frequency stabilizing circuit of claim 4, wherein the divider is set with a dividing ratio N that satisfies an expression N=fW, provided that f is a constant frequency from the modulated pulse signal corresponding to the synchronous signal of the image signal, and W is a pulse width of the first pulse signal outputted from the detecting means.

6. The frequency stabilizing circuit of claim 2, wherein:

the level detecting circuit consists of a voltage source having a given voltage and a comparator that compares the voltage of the image signal and the given voltage of the voltage source, and produces an output signal when the voltage of the image signal is lower than the given voltage; and the pulse outputting circuit consists of a time constant circuit based on which a pulse width W is determined, and a monostable multivibrator that outputs the first pulse signal that has a pulse width comparable to the time constant of the time constant circuit when the comparator activates the multivibrator.

7. The frequency stabilizing circuit of claim 6, wherein the pulse modulator is designed so that it uses a modulation method by which the number of pulses of the modulation signal per unit time is changed in accordance with the voltage level of the image signal inputted.

8. The frequency stabilizing circuit of claim 7, wherein the pulse modulator is a modulator selected from the group consisting of modulators for Pulse Frequency Modulation, Square Wave Frequency Modulation, and Pulse Interval Modulation.

9. The frequency stabilizing circuit of claim 6, wherein the feedback controlling means includes:

pulse width comparing means for comparing the pulse width of the first pulse signal outputted from the detecting means and that of the second pulse signal outputted from the pulse generating means to output a third pulse signal having a pulse width comparable to the difference between these two pulse widths;

integrating means for integrating the third pulse signal from the pulse comparing means to output an integral signal in which voltage level is proportional to the pulse width; and adding means for adding the integral signal to the image signal before modulation.

10. The frequency stabilizing circuit of claim 9, wherein the pulse width comparing means consists of a flip-flop that is set by one of the trailing edge of the first pulse signal outputted from the detecting means and the trailing edge of the second pulse signal outputted from the pulse generating means and reset by a trailing edge of the other pulse signal, and a delay element that delays the input of the second pulse signal to the input terminal of the reset side by a given delay time.

11. The frequency stabilizing circuit of claim 1, wherein the feedback controlling circuit includes:

pulse width comparing means for comparing the pulse width of the first pulse signal outputted from the detecting means and that of the second pulse signal outputted from the pulse generating means to output a third pulse signal having a pulse width comparable to the difference between these two pulse widths;

integrating means for integrating the third pulse signal from the pulse comparing means to output an integral signal of which voltage level is comparable to the pulse width; and adding means for adding the integral signal to the image signal before modulation.

12. The frequency stabilizing circuit of claim 11, wherein the pulse width comparing means consists of a flip-flop that is set by one of a trailing edges of the first pulse signal outputted from the detecting means and a trailing edge of the second pulse signal outputted from the pulse generating means whichever comes first, and is reset by the trailing edge of the other pulse signal.

13. The frequency stabilizing circuit of claim 12, wherein:

the detecting means and the pulse generating means are designed so that the pulse signals outputted from the detecting means and the pulse generating means have the same pulse widths when the frequency of the synchronous signal does not deviate;

an input terminal of a reset side of the flip-flop is attached to a delay element; and the delay element provides a delay time sufficient to guarantee that the trailing edge of the pulse signal which resets the flip-flop reaches the flip-flop after the trailing edge of the pulse signal which sets the flip-flop.

14. The frequency stabilizing circuit of claim 13, wherein the pulse modulator is designed so that it uses a modulation method by which the number of pulses of the modulated signal per unit time is changed in accordance with the voltage level of the image signal inputted.

15. The frequency stabilizing circuit of claim 14, wherein the pulse modulator is a modulator selected from the group consisting of modulators for Pulse Frequency Modulation, Square Wave Frequency Modulation, and Pulse Interval Modulation.

16. A frequency stabilizing circuit for stabilizing an output frequency of a signal outputted from a pulse modulator that modulates an image signal including a synchronous signal, the circuit comprising:

synchronous signal detecting means for detecting, before modulation, the synchronous signal included in the image signal that has not yet been modulated;

first pulse generating means for generating a first pulse signal related to the synchronous signal included in the image signal that has not yet been modulated;

second pulse generating means for generating a second pulse signal related to the frequency of the modulated signal outputted from the pulse modulator, said second pulse signal generating depending upon the detection of the synchronous signal; and feedback controlling means for detecting a difference between the pulse widths of the first pulse and the second pulse and for increasing and decreasing a voltage level, depending on the detected difference, of the image signal to be inputted into the pulse modulator.

17. The frequency stabilizing circuit of claim 16, wherein the detecting means includes a voltage level detecting circuit for detecting the synchronous signal by judging the voltage level of the image signal.

18. The frequency stabilizing circuit of claim 17, wherein the first pulse generating means includes a pulse outputting circuit for outputting a pulse signal with a given pulse width when the level detecting circuit detects the synchronous signal.

19. The frequency stabilizing circuit of claim 18, wherein the pulse outputting circuit consists of a time constant circuit based on which a pulse width W is determined, and a monostable multivibrator that outputs the first pulse signal that has a pulse width comparable to the time constant of the time constant circuit when the level detecting circuit detects the synchronous signal.

20. The frequency stabilizing circuit of claim 19, wherein the second pulse generating means is designed so that it activates upon the receipt of the synchronous signal from the level detecting circuit as an enable signal.

21. The frequency stabilizing circuit of claim 20, wherein the second pulse generating means includes a divider for dividing the frequency of the modulated signal by a given dividing ratio.

22. The frequency stabilizing circuit of claim 21, wherein the divider is set with a dividing ratio N that satisfies expression N=f·W, provided that f is a constant frequency from the modulated signal corresponding to the synchronous signal included in the image signal, and W is a pulse width of the pulse outputted from the detecting means.

23. The frequency stabilizing circuit of claim 22, wherein the voltage level detecting circuit consists of a voltage source having a given voltage and a comparator that compares the voltage of the image signal and the given voltage of the voltage source, and activates its output signal when the former is lower than the latter.

24. The frequency stabilizing circuit of claim 23, wherein the pulse modulator is designed so that it uses a modulation method by which the number of pulses of the modulation signal per unit time is changed in accordance with the voltage level of the image signal inputted.

25. The frequency stabilizing circuit of claim 24, wherein the pulse modulator is a modulator selected from the group consisting of modulators for Pulse Frequency Modulation, Square Wave Frequency Modulation, and Pulse Interval Modulation.

26. The frequency stabilizing circuit of claim 25, wherein the feedback controlling means includes:
pulse width comparing means for comparing the pulse width of the first pulse signal and a pulse width of the second pulse signal to output a pulse signal having a pulse width comparable to the difference of these two pulse widths;
integrating means for integrating the pulse signals from the pulse width comparing means to output an integral signal in which voltage level is comparable to the pulse width; and
adding means for adding the integral signal to the image signal before modulation.

27. The frequency stabilizing circuit of claim 26, wherein the pulse width comparing means consists of a flip-flop that is set by one of a trailing edge of the first pulse signal and a trailing edge of the second pulse signal, and reset by the trailing edge of the other pulse signal, and a delay element that delays input of the pulse signal to an input terminal of a reset side of the flip-flop by a given delay time.

28. The frequency stabilizing circuit of claim 16, wherein the feedback controlling means includes:
pulse width comparing means for comparing the pulse width of the first pulse signal and the pulse width of the second pulse signal to output a pulse signal having a pulse width comparable to the difference of these two pulse widths;
integrating means for integrating the pulse signal from the pulse width comparing means to output an integral signal of which voltage level is comparable to the pulse width; and
adding means for adding the integral signal to the image signal before modulation.

29. The frequency stabilizing circuit of claim 28, wherein the pulse width comparing means consists of a flip-flop what is set by one of a trailing edge of the first pulse signal and a trailing edge of the second pulse signal whichever comes first, and is reset by the trailing edge of the other pulse signal.

30. The frequency stabilizing circuit of claim 29, wherein
the first pulse generating means and the second pulse generating means are designed so that the first pulse signal and the second pulse signal have the same pulse width when the frequency of the synchronous signal does not deviate,
an input terminal of a reset side of the flip-flop is attached to a delay element, and
the delay element provides a delay time sufficient to guarantee that the trailing edge of the pulse signal which resets the flip-flop is outputted by the delay element after the pulse signal which sets the flip-flop.

31. The frequency stabilizing circuit of claim 30, wherein the pulse modulator is designed so that it uses a modulation method by which the number of pulses of the modulation signal per unit time is changed in accordance with the voltage level of the image signal inputted.

32. The frequency stabilizing circuit of claim 31, wherein the pulse modulator is a modulator selected from the group consisting of modulators for Pulse Frequency Modulation, Square Wave Frequency Modulation, and Pulse Interval Modulation.

33. A frequency stabilizing circuit for stabilizing an output frequency of a signal produced by a pulse modulator modulating an image signal, said image signal including a synchronous signal, the circuit comprising:
a level detector for detecting the synchronous signal included in the image signal;
a monostable multivibrator for outputting a first pulse signal in response to the synchronous signal from the level detector, the pulse signal being representative of the synchronous signal prior to modulation;
a pulse modulator for modulating the image signal;
a divider for dividing the modulated image signal by a fixed factor and gated by the synchronous signal from the level detector to produce a second pulse signal, the second pulse signal being representative of the synchronous signal after modulation;
a comparator to compare the first pulse signal with the second pulse signal producing a third pulse signal representative of a difference in pulse width between said first and said second pulse signals;
an integrator that produces a voltage from the third pulse signal, the voltage depending on the difference in pulse width between the first pulse signal and the second pulse signal; and
an adder to combine the voltage from the integrator with the image signal prior to said image signal entering the pulse modulator, thereby correcting frequency shifts of the pulse modulator.

34. A frequency stabilizing circuit for stabilizing an output frequency of a signal outputted from a pulse modulator that modulates an image signal including a synchronous signal, the circuit comprising:
detecting means for detecting, before modulation, a synchronous signal included in the image signal and for outputting a first pulse signal representative of the synchronous signal;
pulse generating means for outputting a second pulse signal representative of the synchronous signal after pulse modulation of the image signal by extracting a modulated signal outputted from the pulse modulator, the pulse generating means comprising a divider for dividing the frequency of the modulated signal by a given dividing ratio; and
feedback controlling means for detecting a difference between a pulse width of the first pulse signal outputted from the detecting means and a pulse width of the second pulse signal outputted from the pulse generating means and for increasing and decreasing, depending on the detected difference, a voltage level of the image signal to be inputted to the pulse modulator.

35. The frequency stabilizing circuit of claim 34, wherein the divider is set with a dividing ratio N that satisfies an expression $N=f\cdot W$, wherein f is a constant frequency from the modulated pulse signal corresponding to the synchronous signal of the image signal, and W is a pulse width of the first pulse signal outputted from the detecting means.

36. A frequency stabilizing circuit for stabilizing an output frequency of a signal outputted from a pulse modulator that modulates an image signal including a synchronous signal, the circuit comprising:
  detecting means for detecting, before modulation, a synchronous signal included in the image signal and for outputting a first pulse signal representative of the synchronous signal, the detecting means comprising:
    a level detecting circuit for detecting the synchronous signal by judging the level of the image signal; and
    a pulse outputting circuit for outputting the first pulse signal with a given pulse width when the level detecting circuit detects the synchronous signal;
  pulse generating means for outputting a second pulse signal representative of the synchronous signal after pulse modulation of the image signal by extracting a modulated signal outputted from the pulse modulator; and
  feedback controlling means for detecting a difference between a pulse width of the first pulse signal outputted from the detecting means and a pulse width of the second pulse signal outputted from the pulse generating means and for increasing and decreasing, depending on the detected difference, a voltage level of the image signal to be inputted to the pulse modulator.

37. The frequency stabilizing circuit of claim 36, wherein:
  the level detecting circuit consists of a voltage source having a given voltage and a comparator that compares the voltage of the image signal and the given voltage of the voltage source, and produces an output signal when the voltage of the image signal is lower than the given voltage; and
  the pulse outputting circuit consists of a time constant circuit which determines a pulse width W, and a monostable multivibrator that outputs the first pulse signal having a pulse width equivalent to the pulse width W when the output signal of the comparator activates the multivibrator.

38. The frequency stabilizing circuit of claim 37, wherein the pulse modulator is designed so that it uses a modulation method by which the number of pulses of the modulation signal per unit time is changed in accordance with the voltage level of the image signal inputted.

39. The frequency stabilizing circuit of claim 38, wherein the pulse modulator is a modulator selected from the group consisting of modulators for Pulse Frequency Modulation, Square Wave Frequency Modulation, and Pulse Interval Modulation.

40. The frequency stabilizing circuit of claim 37, wherein the feedback controlling means includes:
  pulse width comparing means for comparing the pulse width of the first pulse signal outputted from the detecting means and the pulse width of the second pulse signal outputted from the pulse generating means to output a third pulse signal having a pulse width comparable to the difference between these two pulse widths;
  integrating means for integrating the third pulse signal from the pulse comparing means to output an integral signal in which voltage level is proportional to the pulse width; and
  adding means for adding the integral signal to the image signal before modulation.

41. The frequency stabilizing circuit of claim 40, wherein the pulse width comparing means consists of a flip-flop that is set by one of a trailing edge of the first pulse signal outputted from the detecting means and a trailing edge of the second pulse signal outputted from the pulse generating means and reset by the trailing edge of the other pulse signal, and a delay element that delays the input of the other pulse signal to an input terminal of a reset side of the flip-flop by a given delay time.

42. A frequency stabilizing circuit for stabilizing an output frequency of a signal outputted from a pulse modulator that modulates an image signal including a synchronous signal, the circuit comprising:
  synchronous signal detecting means for detecting, before modulation, a synchronous signal included in an image signal and for outputting a first pulse signal based on the detection;
  pulse generating means for outputting a second pulse signal representative of the synchronous signal after pulse modulation of the image signal by extracting a modulated signal outputted from the pulse modulator; and
  feedback controlling means for detecting a difference between a pulse width of the first pulse signal outputted from the detecting means and a pulse width of the second pulse signal outputted from the pulse generating means and for increasing and decreasing, depending on the detected difference, a voltage level of the image signal to be inputted to the pulse modulator, the feedback controlling means comprising:
    pulse width comparing means for comparing the pulse width of the first pulse signal outputted from the detecting means and the pulse width of the second pulse signal outputted from the pulse generating means to output a third pulse signal having a pulse width comparable to the difference between these two pulse widths;
    integrating means for integrating the third pulse signal from the pulse comparing means to output an integral signal which has a voltage level comparable to the pulse width of the third pulse signal; and
    adding means for adding the integral signal to the image signal before modulation.

43. The frequency stabilizing circuit of claim 42, wherein the pulse width comparing means consists of a flip-flop that is set by one of a trailing edges of the first pulse signal outputted from the detecting means and a trailing edge of the second pulse signal outputted from the pulse generating means whichever comes first, and is reset by the trailing edge of the other pulse signal.

44. The frequency stabilizing circuit of claim 43, wherein:

the detecting means and the pulse generating means are designed so that the pulse signals outputted from the detecting means and the pulse generating means have the same pulse widths when the frequency of the synchronous signal does not deviate; an input terminal of a reset side of the flip-flop is attached to a delay element; and the delay element provides a delay time sufficient to guarantee that the trailing edge of the pulse signal which resets the flip-flop reaches the flip-flop after the trailing edge of the pulse signal which sets the flip-flop.

45. The frequency stabilizing circuit of claim 44, wherein the pulse modulator is designed so that it uses a modulation method by which the number of pulses of the modulated signal per unit time is changed in accordance with the voltage level of the image signal inputted.

46. The frequency stabilizing circuit of claim 45, wherein the pulse modulator is a modulator selected from the group consisting of modulators for Pulse Frequency Modulation, Square Wave Frequency Modulation, and Pulse Interval Modulation.

47. A frequency stabilizing circuit for stabilizing an output frequency of a signal outputted from a pulse modulator that modulates an image signal including a synchronous signal, the circuit comprising:

synchronous signal detecting means for detecting, before modulation, the synchronous signal included in the image signal that has not yet been modulated, the synchronous signal detecting means comprising a voltage level detecting circuit for detecting the synchronous signal by judging the voltage level of the image signal;

first pulse generating means for generating a first pulse signal representative of the synchronous signal included in the image signal that has not yet been modulated, the first pulse generating means comprising a pulse outputting circuit for outputting a pulse signal with a given pulse width when the level detecting circuit detects the synchronous signal, the pulse outputting circuit comprising;

a time constant circuit for determining a pulse width W is determined; and a monostable multivibrator that outputs a pulse signal when the level detecting circuit detects the synchronous signal, the pulse signal having a pulse width comparable to the time constant of the time constant circuit;

second pulse generating means for generating a second pulse signal representative of the frequency of the modulated signal outputted from the pulse modulator, said second pulse signal generating means designed so that receipt of the synchronous signal from the level detecting circuit acts as an enabling signal, thereby activating the second pulse generating means; and feedback controlling means for detecting the difference between the pulse widths of the first pulse and the second pulse and for increasing and feedback controlling means for detecting the difference between the pulse widths of the first pulse and the second pulse and for increasing and decreasing a voltage level, depending on the detected difference, of the image signal inputted into the pulse modulator.

48. The frequency stabilizing circuit of claim 47, wherein the second pulse generating means includes a divider for dividing the frequency of the modulated signal by a given dividing ratio.

49. The frequency stabilizing circuit of claim 48, wherein the divider is set with a dividing ratio N that satisfies an expression $N=F \cdot W$, wherein f is a constant frequency from the modulated signal corresponding to the synchronous signal included in the image signal, and W is a pulse width of the pulse signal outputted from the detecting means.

50. The frequency stabilizing circuit of claim 49, wherein the voltage level detecting circuit consists of a voltage source having a given voltage and a comparator that compares the voltage of the image signal and the given voltage of the voltage source, and outputs a signal when the former is lower than the latter.

51. The frequency stabilizing circuit of claim 50, wherein the pulse modulator is designed so that it uses a modulation method in which the number of pulses of the modulation signal per unit time is changed in accordance with the voltage level of the image signal inputted.

52. The frequency stabilizing circuit of claim 51, wherein the pulse modulator is a modulator selected from the group consisting of modulators for Pulse Frequency Modulation, Square Wave Frequency Modulation, and Pulse Interval Modulation.

53. The frequency stabilizing circuit of claim 52, wherein the feedback controlling means includes:

pulse width comparing means for comparing the pulse width of the first pulse signal and the pulse width of the second pulse signal to output a third pulse signal having a pulse width comparable to the difference of these two pulse widths;

integrating means for integrating the third pulse signal from the pulse width comparing means to output an integral signal having a voltage level comparable to the pulse width of the third pulse signal; and adding means for adding the integral signal to the image signal before modulation.

54. The frequency stabilizing circuit of claim 53, wherein the pulse width comparing means consists of a flip-flop that is set by one of the trailing edge of the first pulse signal and the trailing edge of the second pulse signal, and reset by the trailing edge of the other pulse signal, and a delay element that delays input of the other pulse signal to a reset side of the flip-flop by a given delay time.

55. A frequency stabilizing circuit for stabilizing an output frequency of a signal outputted from a pulse modulator that modulates an image signal which includes a synchronous signal, the circuit comprising:

synchronous signal detecting means for detecting, before modulation, a synchronous signal included in an image signal that has not yet been modulated;

first pulse generating means for generating a first pulse signal representative of the synchronous signal included in the image signal that has not yet been modulated;

second pulse generating means for generating a second pulse signal representative of the frequency of the modulated signal outputted from the pulse modulator, said second pulse signal generating depending upon the detection of the synchronous signal; and feedback controlling means for detecting a difference between pulse widths of the first pulse signal and the second pulse signal and for increasing and decreasing a voltage level, depending on the detected difference, of the image signal inputted into the pulse modulator, the feedback controlling means comprising:
pulse width comparing means for comparing the pulse width of the first pulse signal and the pulse width of the second pulse signal to output a third pulse signal having a pulse width comparable to the difference of these two pulse widths;
integrating means for integrating the third pulse signal from the pulse width comparing means to output an integral signal which has a voltage level comparable to the pulse width of the third pulse signal; and
adding means for adding the integral signal to the image signal before modulation.

56. The frequency stabilizing circuit of claim 55, wherein the pulse width comparing means consists of a flip-flop what is set by one of a trailing edge of the first pulse signal and a trailing edge of the second pulse signal whichever comes first, and is reset by a trailing edge of the other pulse signal.

57. The frequency stabilizing circuit of claim 56, wherein the first pulse generating means and the second pulse generating means are designed so that the first pulse signal and the second pulse signal have the same pulse width when the frequency of the synchronous signal does not deviate, an input terminal of a reset side of the flip-flop is attached to a delay element, and the delay element has a delay time of a length sufficient to guarantee that a trailing edge of the pulse signal that resets the flip-flop is outputted by the delay element after the pulse signal that sets the flip-flop.

58. The frequency stabilizing circuit of claim 57, wherein the pulse modulator is designed so that it uses a modulation method by which the number of pulses of the modulation signal per unit time is changed in accordance with the voltage level of the image signal inputted.

59. The frequency stabilizing circuit of claim 58, wherein the pulse modulator is a modulator selected from the group consisting of modulators for Pulse Frequency Modulation, Square Wave Frequency Modulation, and Pulse Interval Modulation.

* * * * *